United States Patent [19]

Schollmeier

[11] 4,121,171

[45] Oct. 17, 1978

[54] FILTERING CIRCUIT FOR A PHASE-LOCKED LOOP

[75] Inventor: Gero Schollmeier, Gauting, Fed. Rep. of Germany

[73] Assignee: Siemens Aktiengesellschaft, Fed. Rep. of Germany

[21] Appl. No.: 814,900

[22] Filed: Jul. 12, 1977

[30] Foreign Application Priority Data

Jul. 15, 1976 [DE] Fed. Rep. of Germany ....... 2631937

[51] Int. Cl.² ............................................ H03B 3/04
[52] U.S. Cl. ...................................... 331/1 A; 331/16
[58] Field of Search ................ 331/1 A, 16; 307/295; 328/133; 325/420

[56] References Cited

U.S. PATENT DOCUMENTS 4,027,274  5/1977  Fukui et al. ............................ 331/17

*Primary Examiner*—John Kominski
*Attorney, Agent, or Firm*—Schuyler, Birch, Swindler, McKie & Beckett

[57] ABSTRACT

The invention relates to a novel filtering circuit whereby a phase detected output control signal is filtered and utilized to provide greater stability in a phase-locked loop. The filtering circuit is placed in the connecting path between a phase detector and an oscillator; the oscillator supplies output signals, having a repetition rate which depends on the instantaneous values of the filtered control signal. The filtering circuit comprises an adder which adds the phase detected control signal to a signal corresponding to the preceding filtered control signal multiplied by a constant factor which is less than unity ($<1$).

3 Claims, 3 Drawing Figures

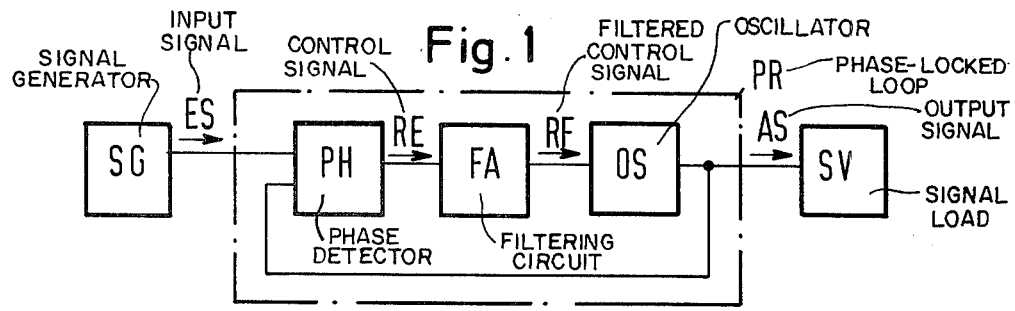
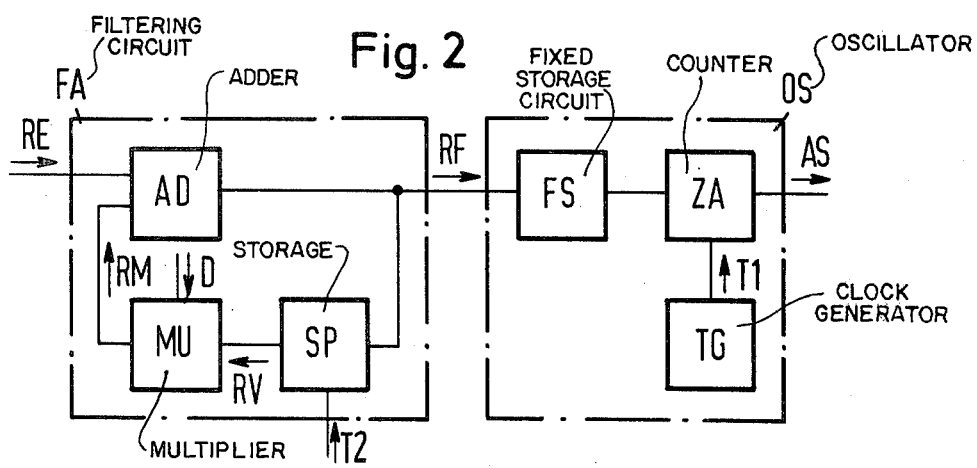
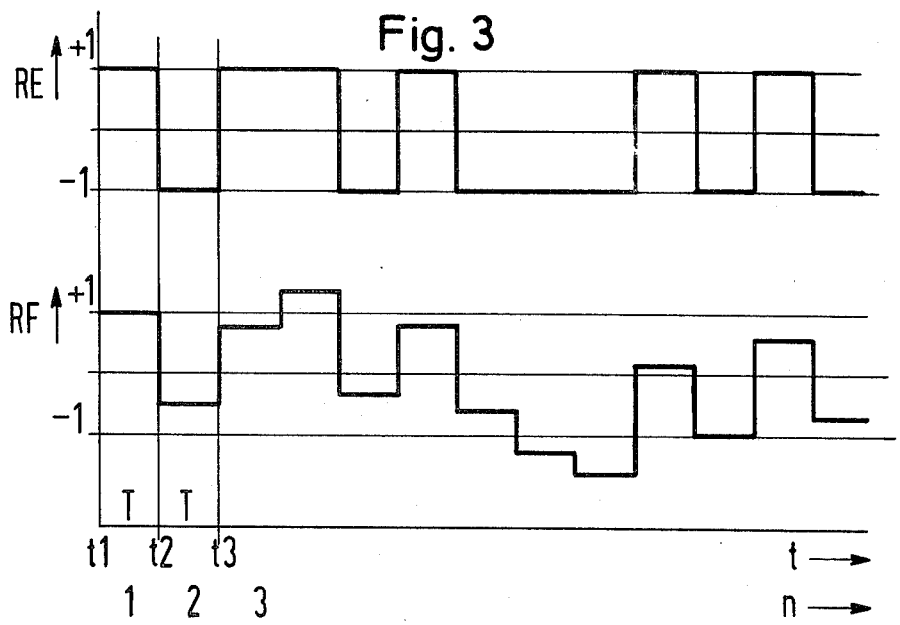

FILTERING CIRCUIT FOR A PHASE-LOCKED LOOP

BACKGROUND OF THE INVENTION

The invention relates to a filtering circuit for filtering a control signal generated in a phase-locked loop. The phase-locked loop comprises a phase detector, an oscillator, and a filtering circuit connected between the phase detector and the oscillator. The phase detector determines the phase difference between an input signal, applied to the detector, and an output signal generated by the oscillator; the detector produces the control signal, the instantaneous value of which depends upon this phase difference. The filtering circuit receives this phase detecting control signal and produces a filtered control signal which is applied to the oscillator; the repetition rate of the oscillator output signal being variable as a function of the instantaneous values of the filtered control signal.

It is a known practice to provide in phase-locked loops a filtering circuit which filters a control signal supplied at the output of the phase detector stage. The filtered control signal is then supplied to an oscillator stage of the phase-locked loop. The oscillator generates an output signal, the repetition rate of which depends on the instantaneous values of the filtered control signal. Generally, a filter is utilized if there exists a substantial difference between the repetition rates of an input signal applied to the phase detector and the output signal generated by the oscillator. Accordingly, the phase-locked loop, with the aid of the filter, produces an error signal from the phase difference between the input signal and the output signal; this error signal, in the phase-locked state, is proportional to the difference between the repetition rates. Such filtering of the control signal may, however, lead to instability of the phase-locked loop; this is the case, for example, if an integrating network is utilized as a filter.

SUMMARY OF THE INVENTION

It is a principal object of the invention to provide a novel filtering circuit between the phase detector and oscillator in a phase-locked loop for filtering a control signal utilized in the loop. This filtering circuit achieves great stability of the phase-locked loop by controlling the variation of the repetition rate of the oscillator output signal in proportion to the instantaneous value of the filtered control signal.

The object of the invention is obtained as follows: an adder is utilized which receives at its first input a control signal from the phase detector and provides at its output the filtered control signal; a storage means connected to the output of the adder is utilized delaying the filtered control signal by a period of the phase detected control signal; a multiplier connected to the output of the adder multiplies the delayed control signal by a factor which is less than unity ($<1$); and, a second input of the adder receives the output of the multiplier.

The filtering circuit constructed in accordance with the principles of the invention has the advantage of providing a very small variance of phase difference between the input signal and output signal. When utilizing the filtering circuit of the invention in a phase-locked loop for transmitting data, the most favorable sampling instants of the data are strictly observed and probability of errors are minimized during the transmission of the data.

Construction of the filtering circuit of the invention is simple if the control signal is formed as a binary signal; whereby the binaries relate to the sign of the phase difference between input signal and output signal.

If the filtering circuit of the invention is inserted in a digital phase-locked loop, it is advisable to construct the adder AD, the storage SP, and the multiplier MU as digital devices.

BRIEF DESCRIPTION OF THE DRAWINGS

A preferred embodiment of the filtering circuit constructed in accordance with the teachings of the invention will be described hereinbelow by reference to FIGS. 1-3:

FIG. 1 is a block diagram showing the basic design of a phase-locked loop consisting of a phase detector PH, a filtering circuit FA, and an oscillator OS;

FIG. 2 is a detailed block diagram of a phase-locked loop comprising a filtering circuit FA according to the invention and an oscillator OS; and FIG. 3 consists of waveform time diagrams of signals at various points in the filtering circuit.

DETAILED DESCRIPTION OF THE DRAWINGS

Referring to FIG. 1, there is shown an input signal ES applied from signal generator SG to phase-locked loop PR. Phase-locked loop PR supplies an output signal AS to signal load SV. Phase-locked loop PR functions in such a manner to regulate the repetition rate and the phase of output signal AS in order to equal, respectively, the repetition rate and the phase of input signal ES. Phase-locked loop PR comprises phase detector PH which determines the phase difference between input signal ES and output signal AS. Phase detector PH supplies at its output a phase detecting control signal RE to filtering circuit FA. Control signal RE, generated by phase detector PH, may be proportional to the magnitude of the phase difference between input signal ES and output signal AS, or control signal RE may indicate merely the sign of the phase difference. Filtering circuit FA receives, at its input, control signal RE and supplies at its output a filtered control signal RF which is fed to oscillator OS. The oscillator generates the output signal AS which is applied to signal load SV and back to the input of phase detector PH. The repetition rate of the output signal AS depends upon the instantaneous value of the filtered control signal RF. Accordingly, the repetition rate variations of the output signal AS are proportional to the repetition rate variations of filtered control signal RF.

Referring to FIG. 2, there is shown the filtering circuit FA comprising an adder AD, a storage circuit SP, and a multiplier circuit MU. These devices can be digital components. Oscillator OS, connected to filtering circuit FA, comprises a fixed storage circuit FS (e.g., a ROM), a counter ZA and a clock generator TG. These devices can also be digital components. Clock generator TG supplies steady repetition rate pulses T1 to counter ZA.

Varying time ratios are established for counter ZA by the data signal read from fixed storage FS and supplied to counter ZA as a function of the filtered control signal RF. That is, with steady repetition rate pulses T1 supplied to it, counter ZA counts upwardly from a constant initial point to a variable final point; this variable final point is determined by the data signal read from fixed storage FS. In addition, counter ZA automatically resets itself at its initial point each time it reaches the variable final point. Output signal AS is supplied each time the counter reaches its final point; consequently, the repetition rate of output signal AS varies. The repetition rate of output signal AS and, thereby, the variable final point is determined by the data signal which is read from fixed storage FS and supplied to counter ZA as a function of filtered control signal RF.

Since oscillator OS is a digital component, it is advisable to utilize a digital filtering circuit FA. Therefore, control signal RE represents a signal made up of binary digits, the value of which depends upon the phase difference between input signal ES and output signal AS. Similarly, filtered control signal RF represents a signal made up of binary digits.

To ensure the stability of phase-locked loop PR, filtering circuit FA generates the digital filtered control signal RF on the basis of the following equation:

$$RF(n) = \sum_{i=1}^{n} D^{n-i} \cdot RE(i)$$

where the constant factor D is $<1$, $RF(n)$ is the filtered control signal RF, supplied during the $n^{th}$ period of control signal RE, at the output of filtering circuit FA. On the basis of the above equation, the filtered control signal RF, during the first period of control signal RE, is:

$$RF(1) = RE(1).$$

Similarly, filtered control signals RF during the subsequent three periods are as follows:

$$RF(2) = D \cdot RE(1) + RE(2);$$

$$RF(3) = D^2 \cdot RE(1) + D \cdot RE(2) + RE(3);$$

and $$RF(4) = D^3 \cdot RE(1) + D^2 \cdot RE(2) + D \cdot RE(3) + RE(4).$$

Further details of filtering circuit FA will be described with reference to the time diagrams shown in FIG. 3.

These diagrams shown in FIG. 3 illustrate signals at various points in filtering circuit FA. The time $t$ and the number $n$ are plotted by measuring parallel to the $x$-axis; the instantaneous values of control signal RE and filtered control signal RF are plotted by measuring parallel to the $y$-axis. In the present embodiment it is assumed that control signal RE is a binary signal; the binaries $+1$ and $-0$ refer to the sign of the phase difference between input signal ES and output signal AS.

At instant $t1$ control signal RE, having a period T, is at its defined $+1$ digital state. Control signal RE is applied to the first input of adder AD in filtering circuit FA. Assuming that filtered control signal RF is at its reset state prior to time $t1$, this reset state is likewise stored in storage SP and a signal RM having the reset state is likewise supplied at the output of multiplier MU and applied to the second input of adder AD. Thus, adder AD supplies at its output a filtered control signal RF which is also at its defined $+1$ digital state. Therefore, as shown in FIG. 2, filtered control signal RF is applied to oscillator OS and to storage SP in filtering circuit FA. This defined $+1$ digital stage of output RF is placed into storage in conjunction with a clock pulse T2. Clock pulse T2 is generated in clock generator TG; clock pulse T2 appears after instant $t1$ and prior to the end of period T of control signal RE.

After instant $t2$, control signal RE changes to the $-1$ state. Control signal RE is again applied to the first input of adder AD. At the output of storage SP the defined $+1$ state of filtered control signal RF is supplied as signal RV between instants $t1$ and $t2$ to a first input of multiplier MU. A signal D, represented in the above equation, is applied to a second input of multiplier MU, as a constant factor; this factor is less than 1. If, for example, this factor is 0.5 and the output of storage SP is $+1$, then the value 0.5 ($+1 \times 0.5$) is supplied as signal RM at the output of multiplier MU. Since the value of control signal RE is $-1$ after instant $t2$, the filtered control signal RF at the output of adder AD will have the value of $-0.5$ ($-1 \times 0.5$) during that time. Accordingly, the repetition rate of output signal AS will be changed in oscillator OS in conformity with the value 0.5 of filtered control signal RF. Similarly, the instantaneous values of filtered control signal RF are determined after each period of control signal RE.

In addition to the time $t$, the variable $n$ is also plotted in FIG. 3 and on the basis of the above equations. If, for example, the factor D equals 0.5 the value of filtered control signal RF during the third period T ($n=3$) of control signal RE, is as follows:

$$RF(3) = \tfrac{1}{4} \cdot (+1) + \tfrac{1}{2} \cdot (-1) + 1 \cdot (+1) = 0.75.$$

If control signal RE not only indicates the sign of the phase difference between the input signal ES and the output signal AS but is also proportional to the phase difference between these signals, more accurate increments of filtered control signal RF will result. In that case, however, a substantially greater number of devices, particularly in adder AD, will be required.

If a voltage-controlled oscillator is provided as oscillator OS which is activated by an analog filtered signal RF, the filtering circuit may also be constructed with analog devices. For such operation, a summing network utilizing a series connected operational amplifier may be substituted for the adder AD, a delay element substituted for storage SP, and an analog multiplier or an amplifier substituted for the digital multiplier MU.

The principles of the invention are described hereinabove by describing the construction and operation of a preferred embodiment. The described embodiment is exemplory only, and it can be modified or changed in a number of ways known to those skilled in the art while remaining within the scope of the invention, as defined by the appended claims.

I claim:

1. A phase-locked loop receiving an input signal and generating an output signal comprising:

a phase detector means coupled to said input and output signals for detecting the phase difference between said input and output signals, said phase detector means producing a phase detecting control signal having instantaneous values depending upon said phase difference;

an oscillator coupled to said phase detector for generating said output signal;

a filtering circuit, receiving said phase detecting control signal, for producing a filtered control signal, whereby said filtered control signal is applied to said oscillator to vary the repetition rate of said output signal as a function of the instantaneous value of said filtered control signal;

wherein the filtering circuit further comprises: an adder circuit having first and second inputs, wherein said phase detecting control signal is applied to said first input and said filtered control signal is supplied at an output of said adder;

a storage circuit means connected to said adder output for producing a storage circuit output signal which represents the filtered control signal delayed by a period of said phase detecting control signal; and a multiplier means coupled to said storage circuit means for producing a multiplier output signal which represents the storage circuit output signal multiplied by a constant factor which is less than unity, wherein the multiplier output signal is applied to the second input of said adder.

2. The phase-locked loop of claim 1 wherein the phase detecting control signal is a binary signal having instantaneous values which correspond to the sign of the phase difference between said input and output signals.

3. The phase-locked loop of claim 1 wherein said adder, said storage circuit means and said multiplier means are digital operating devices.

* * * * *